United States Patent
Teraguchi

(10) Patent No.: US 8,841,939 B2
(45) Date of Patent: Sep. 23, 2014

(54) SWITCHING CONTROL CIRCUIT AND SWITCHING DEVICE

(71) Applicant: Kabushiki Kaisha Toshiba, Tokyo (JP)

(72) Inventor: Takayuki Teraguchi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/758,126

(22) Filed: Feb. 4, 2013

(65) Prior Publication Data

US 2014/0015570 A1    Jan. 16, 2014

(30) Foreign Application Priority Data

Jul. 11, 2012   (JP) .................................. 2012-155570

(51) Int. Cl.
| | | |
|---|---|---|
| H03B 1/00 | (2006.01) | |
| H03K 3/00 | (2006.01) | |
| H03K 17/00 | (2006.01) | |

(52) U.S. Cl.
CPC .................................. H03K 17/002 (2013.01)
USPC ........... 327/108; 327/109; 327/110; 327/111; 327/112

(58) Field of Classification Search
CPC ......... H03K 17/002; H03H 7/40; H02J 5/005; H04L 25/0272
USPC ........................ 327/108, 109, 110, 111, 112
See application file for complete search history.

(56) References Cited

U.S. PATENT DOCUMENTS

| | | | |
|---|---|---|---|
| 7,071,640 B2 * | 7/2006 | Kurosawa et al. | ....... 318/400.04 |
| 8,170,500 B2 | 5/2012 | Seshita et al. | |
| 2004/0051567 A1 | 3/2004 | Kim | |
| 2011/0050323 A1 | 3/2011 | Seshita | |

FOREIGN PATENT DOCUMENTS

| | | |
|---|---|---|
| JP | H4-245580 | 9/1992 |
| JP | H6-162219 | 6/1994 |
| JP | H9-326786 | 12/1997 |
| JP | 2010-103971 | 5/2010 |
| JP | 2010-4515159 | 5/2010 |
| JP | 2011-055099 | 3/2011 |

* cited by examiner

*Primary Examiner* — John Poos
(74) *Attorney, Agent, or Firm* — Patterson & Sheridan, LLP

(57) ABSTRACT

A switching control circuit controls a switching circuit based on decoded signals obtained by decoding several input signals. The switching control circuit is includes a decoder circuit that outputs decoded signals obtained by decoding coded input data signals. The switching control circuit includes a driver circuit that generates control signals for controlling the switching circuit based on the decoded signals. The switching control circuit is provided with a synchronous control circuit that synchronizes the input signals before outputting them for decoding.

20 Claims, 4 Drawing Sheets

SWITCHING CONTROL CIRCUIT AND SWITCHING DEVICE

CROSS-REFERENCE TO RELATED APPLICATION

This application is based upon and claims the benefit of priority from Japanese Patent Application No. 2012-155570, filed Jul. 11, 2012; the entire contents of which are incorporated herein by reference.

FIELD

Embodiments described herein relate to a switching control circuit and a switching device.

BACKGROUND

Conventional switching devices include switching devices, in which several input signals are decoded by a decoder circuit and a driver circuit changes the gate terminal voltage of a switching circuit based on the decoded signals.

When the switching circuit is switched, the decoding circuit sometimes does not generate the desired decoded signals because of a shift in the transition timing of the input signals. In such a case, desired switching of the switching circuit through the driver circuit can be difficult.

DETAILED DESCRIPTION

A switching control circuit and a switching device, which can reduce the influence of a shift in input signals on switching of a switching circuit, are herein disclosed.

In general, an embodiment will be explained with reference to the figures. In this example, the case where the switching device controls a switching circuit using three input signals, each input signal with two levels (e.g., high/low or on/off) so that the switching circuit has $2^3=8$ control (switching) states will be explained. However, the case where the switching circuit is controlled by a number of input signals other than three is also contemplated.

The switching control circuit is provided with a decoder circuit that outputs several decoded signals which are obtained by decoding a plurality of data signals based on a plurality of input signals. The switching control circuit is provided with a driver circuit that outputs a control signal for controlling the switching circuit based on the several decoded signals and a synchronous control circuit that synchronizes the input signals before output to the decoder.

First Embodiment

Figure 1:
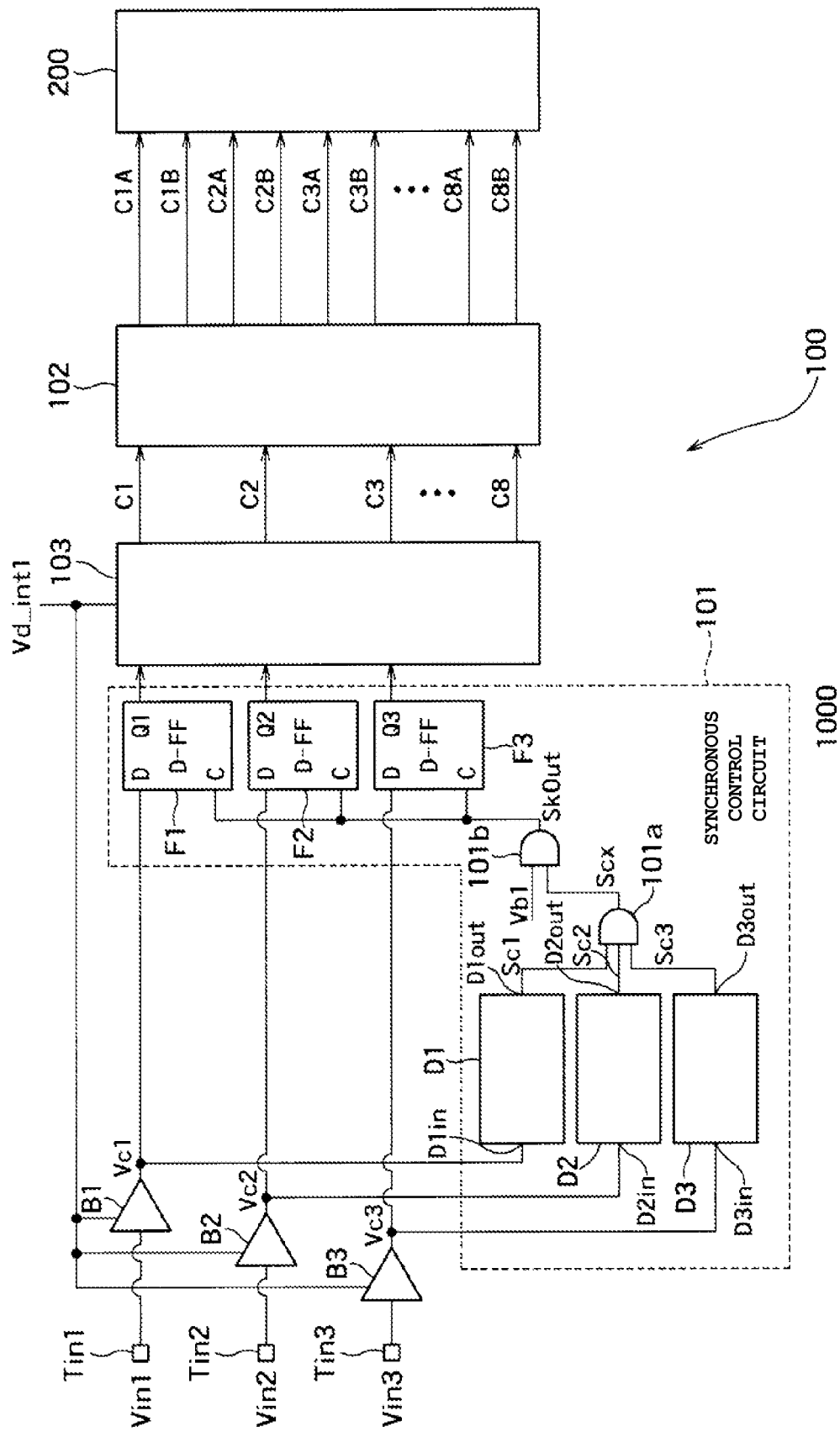
FIG. 1 is a block diagram showing an example configuration of a switching device provided with a switching control circuit according to a first embodiment.

FIG. 1 is a block diagram showing an example configuration of a switching device 1000 provided with a switching control circuit 100 of the first embodiment.

As shown in FIG. 1, the switching device 1000 is provided with the switching control circuit 100 and a switching circuit 200.

The switching circuit 200 has several switching elements (not shown in the figure) that are controlled by a control signal (gate control voltage).

The switching control circuit 100 controls the switching circuit 200 using several decoded signals C1-C8 obtained by decoding the several input signals Vin1-Vin3.

The switch control circuit 100, as shown in FIG. 1, for example, is provided with first input terminal Tin1, second input terminal Tin2, third input terminal Tin3, first to third buffers B1-B3, synchronous control circuit 101, driver circuit 102, and decoder circuit 103.

A first input signal Vin1 is input into the first input terminal Tin1. A second input signal Vin2 is input into the second input terminal Tin2. A third input signal Vin3 is input into the third input terminal Tin3.

Eight switching states of the switching circuit 200 can be designated by these first to third input signals Vin1-Vin3.

The first buffer B1 receives the input of the first input signal Vin1 and outputs a first data signal Vc1 in which the first input signal Vin1 has been amplified.

The second buffer B2 receives the input of the second input signal Vin2 and outputs a second data signal Vc2 in which the second input signal Vin2 has been amplified.

The third buffer B3 receives the input of the third input signal Vin3 and outputs a third data signal Vc3 in which the third input signal Vin3 has been amplified.

These first to third buffers B1-B3 constitute an I/O (input/output) circuit of the switching control circuit 100.

The decoder circuit 103 outputs several decoded signals C1-C8 based on the values of the first data signal Vc1, the second data signal Vc2, and the third data signal Vc3.

The driver circuit 102 outputs control signals (gate control voltages) C1A, C1B, C2A, C2B, C3A, C3B, . . . C8A, and C8B for controlling the switching circuit 200 based on decoded signals C1-C8.

The synchronous control circuit 101 synchronously controls (synchronizes) the transition timing of the level of decoded signals C1-C8 based on the first, second, and third data signals Vc1, Vc2, and Vc3. In particular, the synchronous control circuit 101 synchronously controls (synchronizes) the transition timing of the level of several decoded signals C1-C8 by synchronizing the transition timing of the level of the first, second, and third data signals Vc1, Vc2, and Vc3 which are input into the decoder circuit 103.

The synchronous control circuit 101, for example, as shown in FIG. 1, includes first signal generating circuit D1, second signal generating circuit D2, third signal generating circuit D3, first arithmetic operation circuit 101a, second arithmetic operation circuit 101b, first flip-flop (D-FF) F1, second flip-flop (D-FF) F2, and third flip-flop (D-FF) F3. Here, the first and second arithmetic operation circuits 101a and 101b are AND circuits.

The first signal generating circuit D1 generates a first clock signal Sc1 that returns to the original level after a lapse of delay time Dt after a transition of the level of the first data signal Vc1.

For example, the first signal generating circuit D1 changes the first clock signal Sc1 from "High" level to "Low" level in synchronization with the transition of the first data signal Vc1 from "Low" level to "High" level and then returns the first clock signal Sc1 to the "High" level after a lapse of delay time Dt.

The second signal generating circuit D2 generates the second clock signal Sc2 that returns to the original level after a lapse of delay time Dt after a transition of the level of the second data signal Vc2.

For example, the second signal generating circuit D2 changes the second clock signal Sc2 from "High" level to "Low" level in synchronization with the transition of the second data signal Vc2 from "Low" level to "High" level and returns the second clock signal Sc2 to "High" level after a lapse of delay time Dt.

The third signal generating circuit D3 generates the third clock signal Sc3 that returns to the original level after a lapse of delay time Dt after a transition of the level of the third data signal Vc3.

For example, the third signal generating circuit D3 changes the third clock signal Sc3 from "High" level to "Low" level in synchronization with the transition of the third data signal Vc3 from "Low" level to "High" level and returns the third clock signal Sc3 to "High" level after a lapse of delay time Dt.

The first arithmetic operation (OR operation) circuit 101a outputs an arithmetic signal ScX. The first clock signal Sc1, second clock signal Sc2, and third clock signal Sc3 are input to the first arithmetic operation circuit 101a.

The second arithmetic operation (or operation) circuit 101b outputs a synchronous clock signal SkOut. The trigger signal Vb1 for notifying the start of a power cycle and the arithmetic signal ScX are input to the second arithmetic operation circuit 101b.

For example, when a power cycle starts, the trigger signal Vb1 changes from "Low" level to "High" level. In other words, when a power cycle starts, the second arithmetic operation circuit 101b outputs the arithmetic signal Scx as the synchronous clock signal SkOut.

In the first flip-flop F1, the first data signal Vc1 is input into a data terminal D, the synchronous clock signal SkOut based on the arithmetic signal Scx is input into a clock terminal C, and the input first data signal Vc1 is output synchronously with the synchronous clock signal SkOut.

In the second flip-flop F2, the second data signal Vc2 is input into a data terminal D, the synchronous clock signal SkOut is input into a clock terminal C, and the input second data signal Vc2 is output synchronously with the synchronous clock signal SkOut.

In the third flip-flop F3, the third data signal Vc3 is input into a data terminal D, the synchronous clock signal SkOut is input into a clock terminal C, and the input third data signal Vc3 is output synchronously with the synchronous clock signal SkOut.

Figure 2:
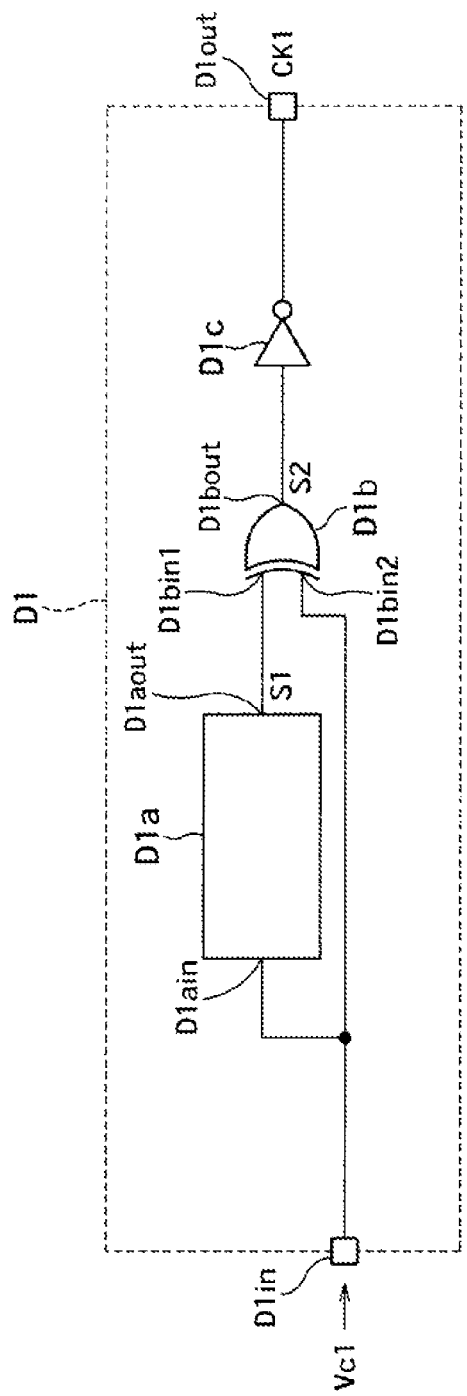
FIG. 2 is a circuit diagram showing an example of a first signal generating circuit shown in FIG. 1.

Here, FIG. 2 is a circuit diagram showing an example of the constitution of the first signal generating circuit D1 shown in FIG. 1.

As shown in FIG. 2, the first signal generating circuit D1, for example, includes delay circuit D1a, XOR circuit D1b, and inverter D1c.

In the delay circuit D1a, an input D1ain is connected to an input D1in of the first signal generating circuit D1, and the input first data signal Vc1 is delayed by the delay time Dt and then output (a delay signal S1 is output).

Figure 3:
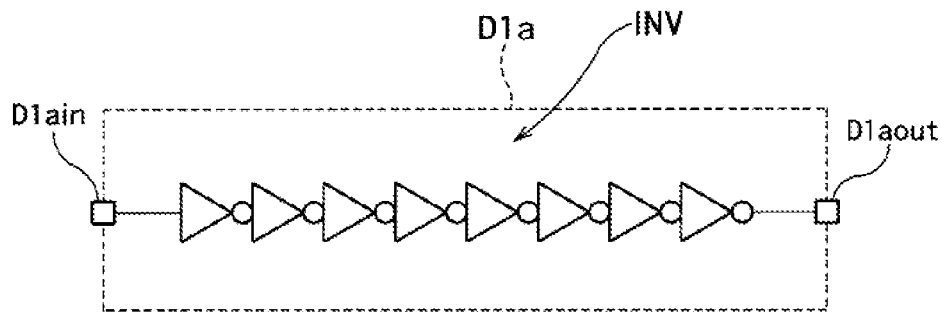
FIG. 3 is a circuit diagram showing an example of a delay circuit shown in FIG. 2.

Here, FIG. 3 is a circuit diagram showing an example of the circuit constitution of the delay circuit D1a shown in FIG. 2.

For example, as shown in FIG. 3, the delay circuit D1a has an inverter circuit INV. In the inverter circuit INV, its input side is connected to the input D1ain of the delay circuit D1, its output side is connected to an output D1aout of the delay circuit D1a, and an even number of inverters connected in series are included.

The delay time Dt of the delay circuit D1a, for example, can be adjusted by changing the total number of the inverters in the inverter circuit INV.

In addition, as shown in FIG. 2, in the XOR circuit D1b, a first input D1bin1 is connected to the output D1aout of the delay circuit D1a, and a second input D1bin2 is connected to the input D1in of the first signal generating circuit D1.

The XOR circuit D1b XOR-operates on the first data signal Vc1 and the delay signal S1, which is output from the delay circuit D1a, and outputs a signal S2 obtained by the XOR operation.

Moreover, in the inverter D1c, its input is connected to the output D1bout of the XOR circuit D1b, and its output is connected to the output D1out of the first signal generating circuit D1.

The inverter D1c receives the input of the signal S2 and outputs a signal (that is, the first clock signal Sc1), in which the signal S2 has been inverted, to the output D1out of the first signal generating circuit D1.

Figure 4:
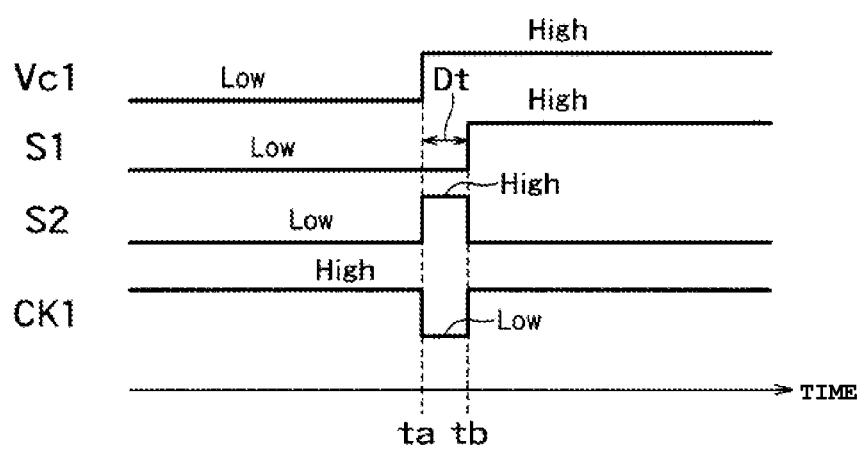
FIG. 4 is a waveform diagram showing an example of the operation waveform of the first signal generating circuit.

Here, FIG. 4 is a waveform diagram showing an example of the operation waveform of the signal generating circuit D1 shown in FIG. 2.

As shown in FIG. 4, for example, at time ta, the first data signal Vc1 changes (transits) from "Low" level to "High" level. Therefore, the XOR circuit D1b transits the signal S2 from "Low" level to "High" level. In addition, the inverter D1c transits the first clock signal Sc1 from "High" level to "Low" level.

At that time, the delay circuit D1a maintains the delay signal S1 at "Low" level.

Next, at time tb after a lapse of delay time Dt from the time ta, the delay circuit D1a transits (changes) the delay signal S1 from "Low" level to "High" level. Therefore, the XOR circuit D1b transits the signal S2 from "High" level to "Low" level. In addition, the inverter D1c transits the first clock signal Sc1 from "Low" level to "High" level.

In other words, the first signal generating circuit D1 outputs the first clock signal Sc1 at "Low" level until the delay Dt has elapsed after the transition of the first data signal Vc1 from "Low" level to "High" level.

The first signal generating circuit D1, as mentioned above, outputs a signal with a level offset by the delay time Dt, in the case where the first data signal Vc1 transits from "High" level to "Low" level as well as the case where first data signal Vc1 transits from "Low" level to "High" level.

Figure 5:
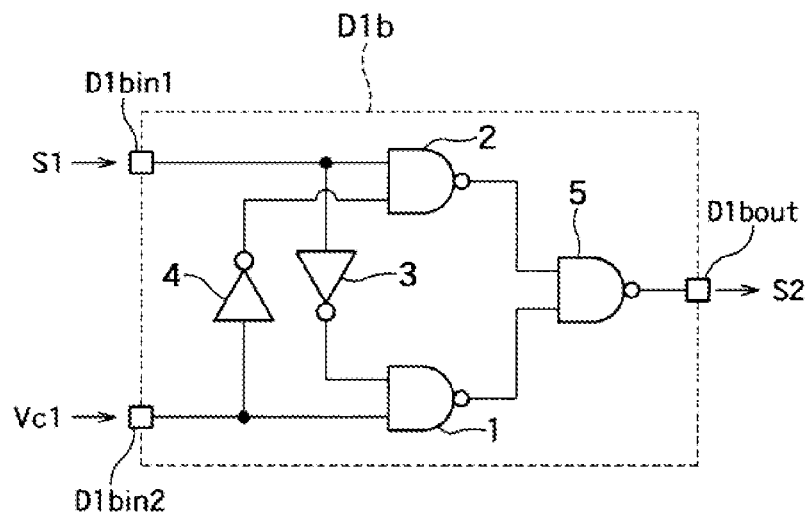
FIG. 5 is a circuit diagram showing an example of an XOR circuit shown in FIG. 2.

Next, FIG. 5 is a circuit diagram showing an example of the circuit constitution of the XOR circuit D1b shown in FIG. 2. As shown in FIG. 5, the XOR circuit D1b, for example, is provided with first AND circuit 1, second AND circuit 2, first inverter 3, second inverter 4, and third AND circuit 5.

In the first inverter 3, its input terminal is connected to the first input D1bin1 of the XOR circuit D1b.

In the first AND circuit 1, its first input terminal is connected to the output of the first inverter 3 and the second input terminal is connected to D1bin2 of the XOR circuit D1b.

In the second inverter 4, its input terminal is connected to the second input terminal D1bin2 of the XOR circuit D1b.

In the second AND circuit 2, the input terminals are connected to the output of the second inverter 4 and the first input D1bin1 of the XOR circuit D1b.

In the third AND circuit 5, has input terminals connected to the outputs of the first and second AND circuits 1 and 2, and its output is connected to the output D1bout of the XOR circuit D1b.

Here, the second and third signal generating circuits D2 and D3 also have circuit constitutions and functions similar to those of the first signal generating circuit D1.

Figure 6:
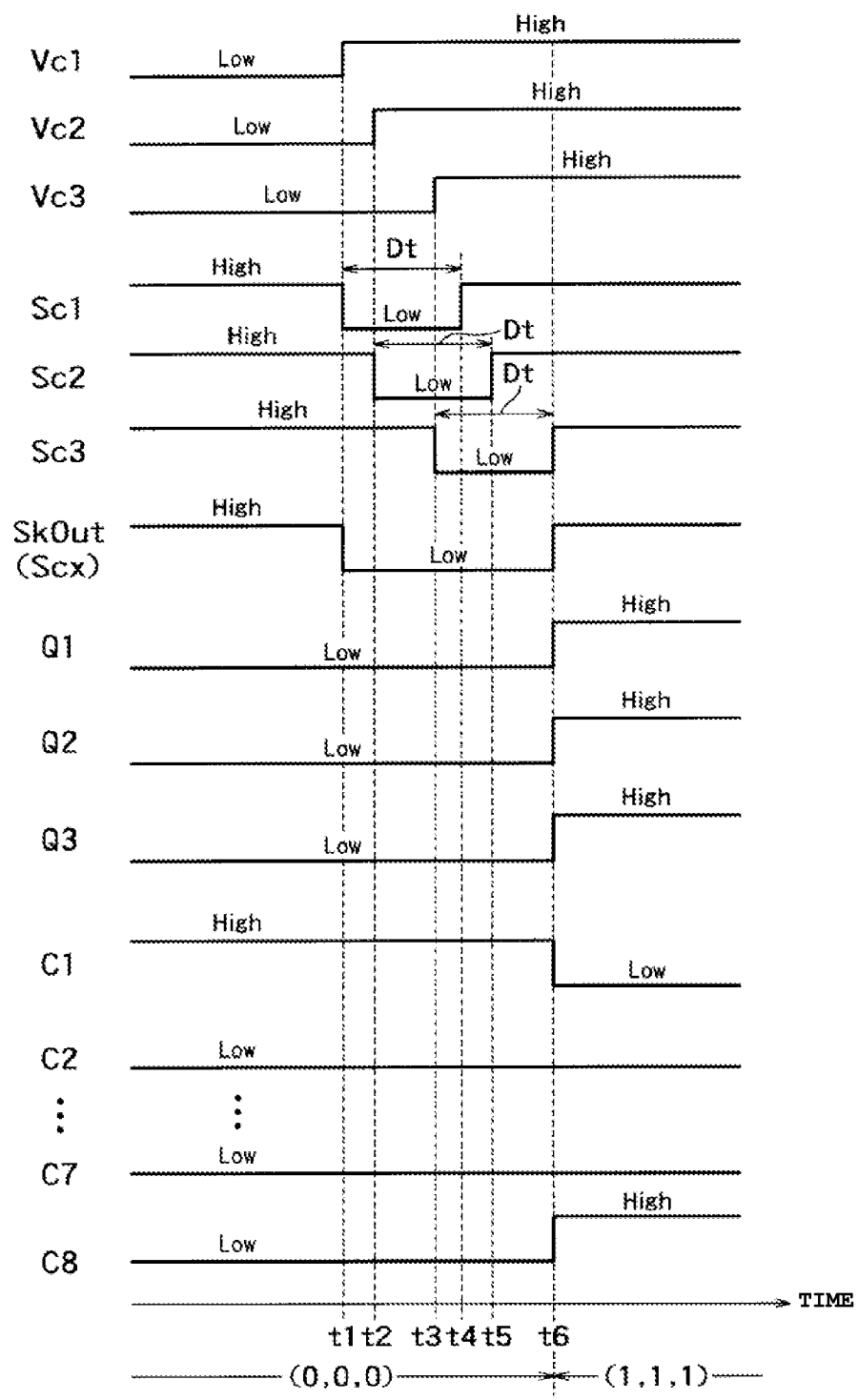
FIG. 6 is a waveform diagram showing an example of the operation waveform of the switching control circuit of the first embodiment.

Next, an example of the operation of the switching control circuit 100 with the above constitution will be explained. Here, FIG. 6 is a waveform diagram showing an example of the operation of the switching control circuit 100 shown in FIG. 1. For the period shown in FIG. 6, the trigger signal Vb1 is at "High" level, that is, in a state in which a power cycle starts. Therefore, the synchronous clock signal SkOut is a signal equivalent to the arithmetic signal Scx. In addition, as mentioned above, the switching state of the switching circuit can be defined from among $2^3$ control states. In other words, first control state can correspond to (0, 0, 0), the second state (0, 0, 1), the third state (0, 1, 0), the fourth state (1, 0, 0), ... , and eighth state (1, 1, 1) as defined in accordance with the levels of the first, second, and third data signals Vc1, Vc2, and Vc3.

Next, for example, in the case of the first state (0, 0, 0), the decoded signal C1="High" level, and the decoded signals C2-C8="Low" level. In the case of the second state (0, 0, 1), the decoded signal C2="High" level, and the decoded signals C1 and C3-C8="Low" level. In the case of the third state (0, 1, 0), the decoded signal C3="High" level, and the decoded signals C1, C2, and C4-C8="Low" level. In the case of the fourth state (1, 0, 0), the decoded signal C4="High" level, and the decoded signals C1-C3 and C5-C8="Low" level. Finally, in the case of the eighth state (1, 1, 1), the decoded signal C8="High" level, and the decoded signals C1-C7="Low" level.

As shown in FIG. 6, for example, at time t1, the first data signal Vc1 transits from "Low" level to "High" level.

Therefore, the first signal generating circuit D1 transits the first clock Sc1 from "High" level to "Low" level.

Moreover, the second arithmetic operation circuit 101b transits the synchronous clock signal SkOut from "High" level to "Low" level. The first to third flip-flops F1-F3 receive the synchronous clock signal SkOut and maintain the logic ("0," that is, "Low" level) of the outputs Q1, Q2, and Q3.

In other words, the logic of the first to third data signals Vc1-Vc3, held by the first to third flip-flops F1-F3, is continuously input into the decoder circuit 103. For this reason, the decoder circuit 103 continuously outputs the decoded signal C1="High" level and the decoded signals C2-C8="Low" level corresponding to the first state (0, 0, 0).

Next, at time t2, the second data signal Vc2 transits from "Low" level to "High" level.

Therefore, the second signal generating circuit D2 transits the second clock signal Sc2 from "High" level to "Low" level.

At that time, the second arithmetic operation circuit 101b maintains the synchronous clock signal SkOut at "Low" level. In other words, the first to third flip-flops F1-F3 receive the synchronous clock signal SkOut and maintain the logic ("0," that is, "Low" level) of the outputs Q1, Q2, and Q3.

Next, at time t3, the third data signal Vc3 transits from "Low" level to "High" level.

Therefore, the third signal generating circuit D3 transits the third clock signal Sc3 from "High" level to "Low" level.

At that time, the second arithmetic operation circuit 101b maintains the synchronous clock signal SkOut at "Low" level. In other words, the first to third flip-flops F1-F3 receive the synchronous clock signal SkOut and maintain the logic ("0," that is, "Low" level) of the outputs Q1, Q2, and Q3.

Next, at time t4 after a lapse of delay time Dt from the time t1, the first signal generating circuit D1 transits the first clock signal Sc1 from "Low" level to "High" level.

At that time, the second arithmetic operation circuit 101b maintains the synchronous clock signal SkOut at "Low" level. In other words, the first to third flip-flops F1-F3 receive the synchronous clock signal SkOut and maintain the logic ("0," that is, "Low" level) of the outputs Q1, Q2, and Q3.

Next, at time t5 after a lapse of delay time Dt from the time t2, the second signal generating circuit D2 transits the second clock signal Sc2 from "Low" level to "High" level.

At that time, the second arithmetic operation circuit 101b maintains the synchronous clock signal SkOut at "Low" level. In other words, the first to third flip-flops F1-F3 receive the synchronous clock signal SkOut and maintain the logic ("0," that is, "Low" level) of the outputs Q1, Q2, and Q3.

Next, at time t6 after a lapse of delay time Dt from the time t3, the third signal generating circuit D3 transits the third clock signal Sc3 from "Low" level to "High" level.

Therefore, the second arithmetic operation circuit 101b transits the synchronous clock signal SkOut from "Low" level to "High" level. The first to third flip-flops F1-F3 receive the synchronous clock signal SkOut and output the level ("1," that is, "High" level) of the first to third data signals Vc1-Vc3, which are input into each data terminal D, from the outputs Q1, Q2, and Q3.

In other words, at time t6, the logic ("1," that is, "High" level) of the first to third data signals Vc1-Vc3, in which the transition of the level has been completed, is synchronously input into the decoder circuit 103. For this reason, the decoder circuit 103 outputs the decoded signals C1-C7="Low" level and the decoded signal C8="High" level corresponding to the eighth state (1, 1, 1).

As mentioned above, even if the timing of the transition of a level of the first to third data signals Vc1-Vc3 (that is, the transition of the level of the first to third input signals Vin1-Vin3) is not synchronous, the synchronous control circuit 101 outputs the logic of the first to third data signals Vc1-Vc3 to the decoder circuit 103 after the transition of the level of the first to third data signals Vc1-Vc3 is completed.

Therefore, the decoder circuit 103 can output the decoded signals C1-C8 corresponding to the first state (0, 0, 0) to the eighth state (1, 1, 1), without outputting the decoded signals C1-C8 in an unexpected or undesired state.

The driver circuit 102 controls the control signals (gate control voltage) C1A, C1B, C2A, C2B, C3A, C3B, ..., C8A, and C8B based on the decoded signals C1-C8, controlling switching of the switching circuit 200.

In other words, according to the switching control circuit of this embodiment, the influence of a time shift of input signals on switching of the switching circuit can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A switching control circuit, comprising:
   a synchronous control circuit configured to receive a plurality of input data signals and to synchronize the plurality of input data signals before outputting said plurality of input data signals;
   a decoder circuit configured to receive the plurality of input data signals from the synchronous control circuit and to generate a plurality of decoded signals based on the plurality of input data signals; and a driver circuit configured to receive the plurality of decoded signals and to generate a plurality of control signals based on the decoded signals for output to a switching circuit.

2. The switching control circuit according to claim 1, further comprising:

a plurality of buffers, each buffer configured to receive an input signal and to amplify said input signal to generate an input data signal, which is supplied to the synchronous control circuit.

3. The switching control circuit according to claim 1, wherein the synchronous control circuit includes:

a plurality of signal generating circuits, each signal generating circuit configured to generate a clock signal for a respective input data signal, wherein the clock signal returns to a base level after a lapse of a predetermined delay time after a level transition in the respective input data signal;

a first arithmetic operation circuit configured to receive as input a plurality of clock signals generated by the plurality of signal generating circuits and to output an arithmetic signal corresponding to an OR operation; and a plurality of flip-flop circuits, each flip-flop circuit including a data terminal configured to receive the respective input data signal and a clock terminal configured to receive the arithmetic signal, wherein the flip-flop circuit is configured to output the respective input data signal in synchronization with the arithmetic signal.

4. The switching control circuit according to claim 3, wherein each signal generating circuit is configured to change the clock signal from "High" level to "Low" level when the respective input data signals changes from "Low" level to "High" level and then to change the clock signal to "High" level after the lapse of the predetermined delay time.

5. The switching control circuit according to claim 3, wherein at least one signal generating circuit includes a delay circuit, a XOR circuit, and an inverter.

6. The switching control circuit according to claim 5, wherein the delay circuit comprises a plurality of inverters connected in series.

7. The switching control circuit according to claim 1, wherein the synchronous control circuit includes:

a plurality of signal generating circuits, each signal generating circuit configured to generate a clock signal for a respective input data signal, wherein the clock signal returns to a base level after a lapse of a predetermined delay time after a level transition in the respective input data signal;

a first arithmetic operation circuit configured to receive as input a plurality of clock signals generated by the plurality of signal generating circuits and to output a first arithmetic signal corresponding to an OR operation;

a second arithmetic operation circuit configured to receive as input a trigger signal indicating the start of a power cycle and the first arithmetic signal and to output a second arithmetic signal corresponding to an OR operation; and a plurality of flip-flop circuits, each flip-flop circuit including a data terminal configured to receive the respective input data signal and a clock terminal configured to receive the second arithmetic signal, wherein the flip-flop circuit is configured to output the respective input data signal in synchronization with the second arithmetic signal.

8. The switching control circuit according to claim 7, wherein each signal generating circuit is configured to change the respective clock signal from "High" level to "Low" level when the respective input data signal changes from "Low" level to "High" level and then change the clock signal to "High" level after the lapse of the predetermined delay time.

9. The switching circuit according to claim 1, wherein there are three input data signals, eight decoded signals, and sixteen control signals.

10. A switching device, comprising:

a switching circuit; and a switching control circuit configured to control the switching circuit based on decoded signals obtained by decoding input signals, the switching control circuit including:

a synchronous control circuit configured to receive a plurality of input data signals and to synchronize the plurality of input data signals before outputting said plurality of input data signals;

a decoder circuit configured to receive the plurality of input data signals from the synchronous control circuit and to generate a plurality of decoded signals based on the plurality of input data signals; and a driver circuit configured to receive the plurality of decoded signals and to generate a plurality of control signals based on the decoded signals for output to a switching circuit.

11. The switching device according to claim 10, further comprising:

a plurality of buffers, each buffer configured to receive an input signal and amplify said input signal to generate an input data signal, which is supplied to the synchronous control circuit.

12. The switching device according to claim 11, wherein the synchronous control circuit includes:

a plurality of signal generating circuits each configured to generate a respective clock signal for a respective input data signal, the clock signal returning to a base level after a lapse of a predetermined delay time after a level transition in the one of the plurality of input data signals;

a first arithmetic operation circuit configured to receive as input a plurality of clock signals generated by the plurality of signal generating circuits and to output an arithmetic signal corresponding to an OR operation; and a plurality of flip-flop circuits, each flip-flop circuit including a data terminal configured to receive a respective input data signal and a clock terminal configured to receive the arithmetic signal, wherein the flip-flop circuit outputs the respective input data signal in synchronization with the arithmetic signal.

13. The switching device according to claim 12, wherein at least one signal generating circuit includes a delay circuit, a XOR circuit, and an inverter.

14. The switching device according to claim 13, wherein the delay circuit comprises a plurality of inverters connected in series.

15. The switching device according to claim 11, wherein the synchronous control circuit includes:

a plurality of signal generating circuits that each generate a clock signal for a respective input data signal, the clock signal returning to a base level after a lapse of a predetermined delay time after a level transition in the respective input data signals;

a first arithmetic operation circuit that receives as input a plurality of clock signals generated by the plurality of signal generating circuits and outputs a first arithmetic signal corresponding to an OR operation;

a second arithmetic operation circuit that receives as input a trigger signal indicating the start of a power cycle and the first arithmetic signal and outputs a second arithmetic signal corresponding to an OR operation; and a plurality of flip-flop circuits, each flip-flop circuit including a data terminal configured to receive the respective input data signal and a clock terminal configured to receive the second arithmetic signal, wherein the flip-flop circuit outputs the respective input data signal in synchronization with the second arithmetic signal.

16. The switching device according to claim 15, wherein at least one signal generating circuit includes a delay circuit, a XOR circuit, and an inverter.

17. The switching device according to claim 16, wherein the delay circuit comprises a plurality of inverters connected in series.

18. A method of generating control signals for a switching circuit, the method comprising:

receiving a plurality of input data signals;

synchronizing the plurality of input data signals;

supplying the plurality of synchronized input data signals to a decoder circuit;

decoding the plurality of synchronized input data signals at the decoder circuit and supplying the decoded input data signals to a driver circuit; and generating the control signals for the switching circuit from the plurality of decoded input data signals.

19. The method according to claim 18, further comprising:

generating the input data signals from input signals by amplifying the input signals.

20. The method according to claim 18, wherein said synchronizing includes:

latching each of the input data signals; and outputting the latched input data signals according to clock signals derived from transition timings of the input data signals.

* * * * *